United States Patent [19]

Slemmer

[11] Patent Number: 5,440,516
[45] Date of Patent: Aug. 8, 1995

[54] TESTING CIRCUITRY OF INTERNAL PERIPHERAL BLOCKS IN A SEMICONDUCTOR MEMORY DEVICE AND METHOD OF TESTING THE SAME

[75] Inventor: William C. Slemmer, Dallas, Tex.

[73] Assignee: SGS-Thomson Microelectronics, Inc., Carrollton, Tex.

[21] Appl. No.: 188,158

[22] Filed: Jan. 27, 1994

[51] Int. Cl.$^6$ ............................................. G11C 11/40
[52] U.S. Cl. ............................... 365/201; 365/189.08; 371/21.1
[58] Field of Search .............. 365/201, 189.09, 189.08; 371/21.1, 21.4

[56] References Cited

U.S. PATENT DOCUMENTS

| | | | |
|---|---|---|---|
| 3,942,164 | 3/1976 | Dunn | 365/214 |
| 4,642,784 | 2/1987 | White, Jr. et al. | 364/551.01 |
| 4,654,827 | 3/1987 | Childers | 365/201 |
| 4,905,194 | 2/1990 | Ohtsuka et al. | 365/185 |
| 4,980,860 | 12/1990 | Houston et al. | 365/189.11 |
| 5,060,198 | 10/1991 | Kowalski | 365/201 |
| 5,144,583 | 9/1992 | Oowaki et al. | 365/206 |
| 5,255,230 | 10/1993 | Chan et al. | 365/201 |
| 5,260,906 | 11/1993 | Mizukami | 365/201 |
| 5,265,051 | 11/1993 | Jeong | 365/189.05 |
| 5,285,419 | 2/1994 | Iyengar | 365/201 |
| 5,371,712 | 12/1994 | Oguchi et al. | 365/230.06 |

Primary Examiner—Joseph A. Popek
Assistant Examiner—Andrew Q. Tran
Attorney, Agent, or Firm—Rodney M. Anderson; Lisa K. Jorgenson; Richard K. Robinson

[57] ABSTRACT

A semiconductor memory including test circuitry for directly determining the functionality of internal circuitry. The gates of test transistors are connected to the ends of signal lines in the memory, examples of which include bit lines, row or word lines, and control signal lines. Upon entry into a special test mode, the test transistors are biased to a voltage such that the active signal, if present, will turn on the test transistor and produce a signal indicating whether or not the active signal reached the test transistor. Multiple test transistors may be used to provide additional information, including the presence of short circuits, and the operation of multiple circuits within the memory.

21 Claims, 7 Drawing Sheets

TESTING CIRCUITRY OF INTERNAL PERIPHERAL BLOCKS IN A SEMICONDUCTOR MEMORY DEVICE AND METHOD OF TESTING THE SAME

This invention is in the field of integrated circuits, and is more specifically directed to the testing and diagnosis of integrated circuit memories.

BACKGROUND OF THE INVENTION

In the manufacture of modern semiconductor integrated circuit memories, functional testing is not only used to screen defective memories from those that meet customer specifications, but also is often used in assisting the analysis of the cause of defective memories. For example, one may infer the cause of failure from the physical pattern of failed memory locations (e.g., single bits, single columns, single rows, pairs of bits, rows or columns). It is also known, particularly in the field of dynamic random access memories (dRAMs), to use the results of specific test sequences or patterns in making the inference of the cause of failures, for example as described in U.S. Pat. No. 4,642,784.

The use of functional test results to gather information regarding the cause of failure is especially beneficial when performed during functional probe test of the memories in wafer form, which is generally the first functional screen applied to the memories. The ability to infer the cause of failures from electrical probe test can either assist, or in some cases eliminate, the necessity for time-consuming and labor-intensive visual inspection of large numbers of failures. In addition, the efficiency with which expensive and scarce analytical resources such as scanning electron microscopy (SEM), Auger analysis and the like can be increased, as the electrical functional results can be used to identify those memories most appropriate for analysis using these tools. Furthermore, defect analysis based upon inferences from electrical functional test results has also greatly increased the amount of analysis data, as data may be acquired from each defective memory device, rather than only from a limited number of visually inspected samples. This increased sample size greatly improves the statistical accuracy of failure analysis, and enables automated statistical techniques to be applied for each manufacturing lot relative to a historical base line.

However, the ability and accuracy of these techniques to infer the true cause of a failing memory is limited, especially where many or all bits of the memory fail the test. This is because the comparison between actual output data received during the test and an expected data result merely indicates the result of the overall memory function, and does not indicate whether internal functional blocks of the memory, such as decoders, sense amplifiers, and the like, are operational.

By way of further background, many conventional logic devices such as microprocessors, application-specific integrated circuits (ASICs), and the like are tested by way of so-called scan testing. According to conventional scan testing, a serial path through the logic circuit is enabled in a special test mode, such that an input vector may be set on selected scan nodes in the device. The device is then operated for one or more operational cycles, and the states of the scan nodes are serially read out of the device. Comparison of the serial scan output with an expected output vector determines the functionality of the device, as well as data regarding the cause or location of failure, in some cases. However, due to the significant surface area constraints in the arrays of memory devices, such scan techniques are not at all suited for the testing and analysis of semiconductor memories.

It is an object of the present invention to provide a method and internal circuitry that directly indicates the operability of functional circuitry within a semiconductor memory.

It is a further object of the present invention to provide such a method and circuitry which can be realized in an efficient manner, relative to chip area.

It is a further object of the present invention to provide such a method and circuitry which does not affect the normal non-test mode operation and performance of the memory.

Other objects and advantages will be apparent to those of ordinary skill in the art having reference to the following specification together with the drawings.

SUMMARY OF THE INVENTION

The invention may be implemented in a semiconductor memory integrated circuit by providing response circuitry at the ends of signal lines internal to the memory. Examples of such signal lines include row, or word, lines driven by an address decoder, block select signals driven by an address decoder, control signals produced by control logic, and bit lines in the memory array. The response circuitry includes a transistor having a conduction path coupled on one end to a bias voltage that is enabled during test mode, and disabled during normal operation, and on another side to a response node; the control electrode is coupled to the far end of the signal line from its drive circuitry. Accordingly, the voltage at the response node is controlled by the operation of the signal line, such that the transistor is made conductive if the signal line is driven as expected.

According to alternative embodiments of the invention, logical operations may be performed on the response nodes of multiple signal lines. These logical operations can determine whether adjacent signal lines are shorted to one another, or can perform other operations useful in the diagnosis of a failure. In addition, the logical combination of multiple response nodes can reduce the test time of the memory device.

DETAILED DESCRIPTION OF THE PREFERRED EMBODIMENTS

Figure 1:
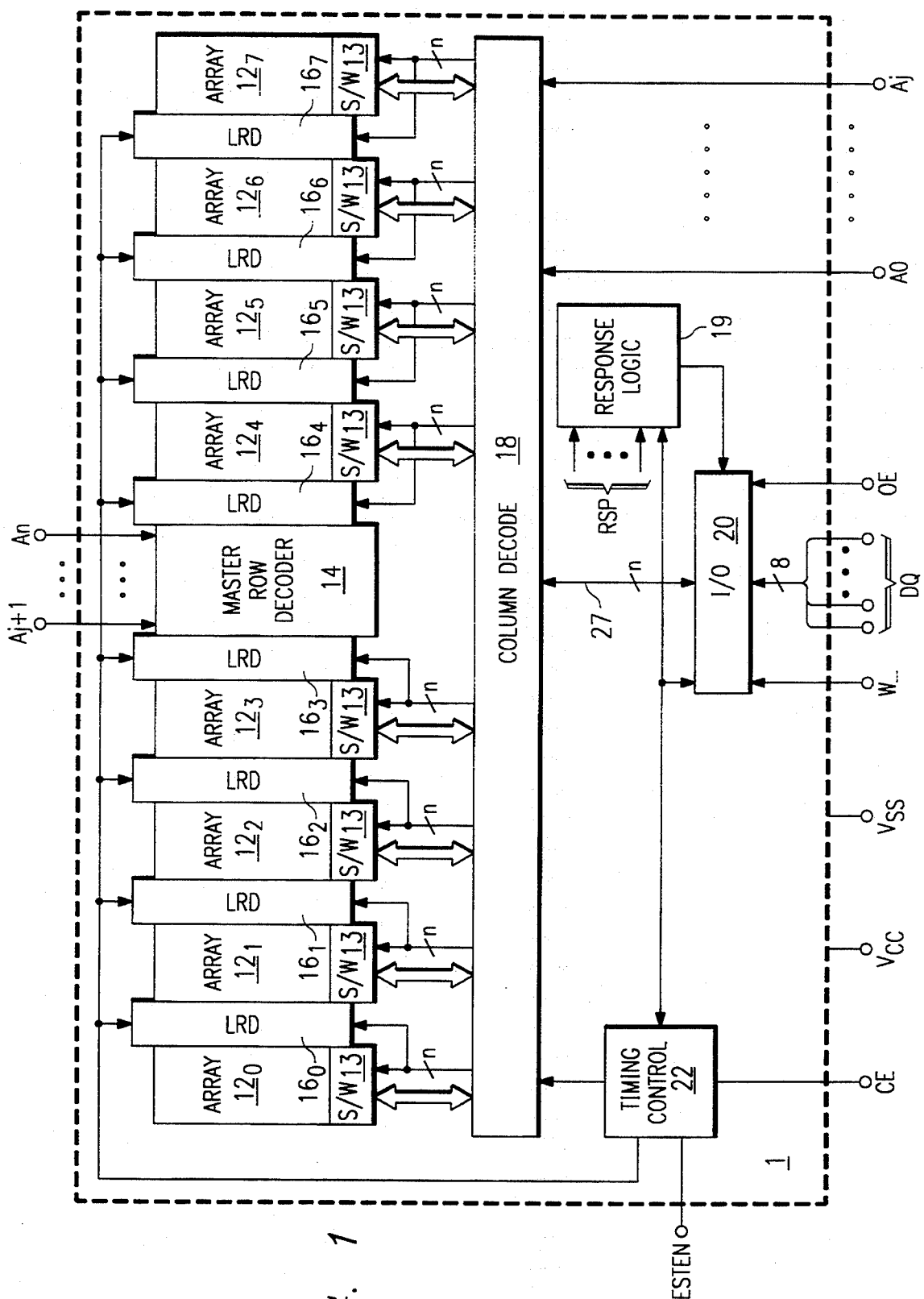
FIG. 1 is an electrical diagram, in block form, of an example of a semiconductor memory incorporating the preferred embodiment of the invention.

FIG. 1 is a block diagram of an integrated circuit memory 1 in which the embodiments of the invention described herein may be implemented. The construction and operation of memory 1 will now be described to provide the context for the description of the preferred embodiments of the invention to follow herein. In this example, memory 1 is an integrated circuit memory of the static random access memory (SRAM) type, having a capacity on the order of $2^{20}$, or U.S. Pat. No. 1,048,576, storage locations or bits, or greater, as currently available for modern SRAMs. Memory 1 in this example is a wide-word memory, organized as $2^n$ addressable locations of eight bits each. As such, data may be presented to, or read from, eight memory locations in each read or write operation, respectively, by way of eight common input/output terminals DQ.

In this example of memory 1, the memory array consists of eight array blocks, or sub-arrays, $12_0$ through $12_7$, each of which have 1024 rows and 128 columns. Memory 1 includes the appropriate number of address terminals $A_0$ through $A_n$ for receiving the address information required to specify a unique memory address. In the conventional manner, the signals at these address terminals are buffered by address buffers (not shown). After such buffering, signals corresponding to some of the address terminals ($A_{j+1}$ through $A_n$) are received by master row decoder 14, which will be used to select one of the rows in a selected array block 12 to be energized.

FIG. 1 illustrates schematically the relative physical location of array blocks 12 relative to one another, and relative to master row decoder 14. For purposes of reducing power consumption, memory 1 according to this embodiment energizes only a selected one of the eight array blocks 12. In this example, master row lines (also referred to in the art as master word lines) extend from master row decoder 14 across all array blocks 12, and are electrically connected to local row decoders 16 which, if corresponding to the selected array block 12, energizes a selected local row line (also referred to in the art as a local word line). As will be described in further detail hereinbelow, in this example of memory 1, the selection of a row of memory cells in array blocks 12 is accomplished by the master row decoder 14 energizing the master row line corresponding to the row address value received at terminals $A_{j+1}$ through $A_n$. One or more of the column address bits, generally the most significant bits, select the array block 12 in which the addressed memory cells reside, and enables the local row decoder 16 for that selected array block 12 to energize the local row line corresponding to the master row line. In addition, as is known in the art for such architectures, local row decoders 16 may also be used to select one-of-n (n commonly being either two or four) local row lines per master row line, according to the least significant bit(s) of the row address. Each local row line controls a row of pass gates in its array block 12 so that, when energized, a row of memory cells are coupled to their respective bit lines.

In an arrangement such as shown in FIG. 1 where row decoder 14 is located centrally, with array blocks 12 on either side thereof, it is preferred that the most significant column address bit (address terminal $A_j$ in this embodiment) also be decoded by master row decoder 14, so that the row line may be energized only on the one side of master row decoder 14 corresponding to the most significant column address bit.

As noted above, the energizing of a local row line connects the contents of memory cells of the selected row in the selected array block 12 to their corresponding bit lines in the conventional manner. Sense/write circuits 13 are provided for each array block 12 to sense the data state on the bit lines (in a read cycle) or to drive the bit lines with the desired data state (in a write cycle) for the selected columns in the selected array block 12. Sense/write circuits 13 may be constructed in the conventional manner to perform the operations of sensing the state of a selected memory cell 30 and for writing data thereto. An example of the construction of a conventional sense/write circuit 13 is described in U.S. Pat. No. 5,267,197, issued Nov. 30, 1993, assigned to SGS-Thomson Microelectronics, Inc., and incorporated herein by reference. Many alternative conventional arrangements and organization of sense/write circuits 13 may also be utilized in memory 1 according to the invention, such arrangements including the assignment of one sense/write circuit for each bit line pair, or the assignment of one sense/write circuit for multiple bit line pairs, with the selection of which bit line pair is to be sensed made by column decoder 18.

Upon coupling of the memory cells in the selected row to their bit lines, column decoder 18 selects those columns in the selected array block 12 according to the value of the remaining bits of the column address, by connecting their corresponding bit lines for the selected columns to the sense/write circuit 13 associated with the selected array block 12. The sense/write circuits 13 so selected by column decoder 18 are placed in communication with input/output circuitry 20 via I/O bus 27, through which the reading of data from or writing of data to the selected memory cells may be done in the conventional manner.

Further included in memory 1 according to this embodiment of the invention, is input/output circuitry 20, which is in communication with column decoder 18 via n-bit I/O bus 27, with input/output terminals DQ, with write enable terminal W_, and with output enable terminal OE. Input/output circuitry 20 includes conventional circuitry for providing and controlling communication between input/output terminals DQ and the memory cells selected according to the address value presented to memory 1, and accordingly will not be described in further detail herein.

Memory 1 further includes timing control circuitry 17, which controls the operation of various portions of memory 1 during a memory cycle in the conventional manner. Timing control circuitry 17 is generally not a specific unitary block of circuitry, as suggested by FIG. 1, but generally is distributed within memory 1 to control the operation of various portions therein. Timing control circuitry 17 receives, for example, signals from terminal CE which enables and disables the operation of memory 1. It should also be noted that, for some static memories, timing control circuitry 17 may also respond according to a conventional address transition detection circuit (not shown), to control the operation of memory 1 dynamically.

Memory 1 according to the present invention is also capable of operating according to special test modes. Selection of such a special test mode may be made in the manner shown in FIG. 1, where a separate terminal TESTEN receives an external signal which indicates whether a special test mode is to be performed, or if memory 1 is to instead operate in its normal functional manner. Such a separate terminal is especially useful for test of memory 1 when in wafer form, prior to assembly and packaging thereof into a conventional chip package. Alternatively, special electrical operations may be performed, using overvoltage and other signals on functional input terminals, to place memory 1 in such a special test mode. Examples of such special electrical operations are described in U.S. Pat. No. 5,072,138, issued Dec. 10, 1991, assigned to SGS-Thomson Microelectronics, Inc., and incorporated herein by reference.

Of course, many alternative organizations of memory 1 may be used in conjunction with the invention described herein. Examples of such organizations would include by-one memories, where a single bit is input to or output from in normal operation. In addition, wide-word memories where each array block is associated with one of the input/output terminals, and memories where the entire array is energized during normal operation, may alternatively be used. Other memory types such as dynamic RAMs, EPROMs, EAROMS, ROMs, embedded memories, dual-port RAMs, FIFOs, and the like, each with organization of their own, may also benefit from this invention.

It should also be noted that other physical and electrical arrangements of the array blocks 12 may be alternatively be used with the present invention. For example, two master row decoders 14 may be incorporated into memory 1, each of which controls the application of a row line signal into half of the memory. Row decoder or decoders 14 may also be located along one edge of its associated array blocks 12, rather than in the middle thereof as shown in FIG. 1. It is contemplated that the particular layout of memory 1 will be determined by one of ordinary skill in the art according to the particular parameters of interest for the specific memory design and manufacturing processes.

Memory 1 according to the preferred embodiment of the invention also includes response logic 19. Response logic 19 receives one or more response lines RSP from special test circuitry (not shown in FIG. 1) for performing direct testing of individual circuit blocks according to the present invention, as will be described in detail hereinbelow. Response logic 19 may also receive a control signal from timing control circuitry 17, for example to indicate whether a special test mode has been entered or if memory 1 is in a normal operating mode. Response logic 19 preferably consists of such logic or gating functions necessary for routing the results of special tests as communicated on response lines RSP to external terminals of memory 1 via I/O circuitry 20, depending upon the number and type of response lines RSP implemented in memory 1. For example, if only a single response line RSP from a single test circuit is present, response logic 19 may consist of only a gating function, controlled by timing control circuitry 17 to present the state of the single response line RSP to I/O circuitry 20. Alternatively, if multiple response lines RSP are implemented, response logic 19 may be implemented as combinatorial logic, for performing a logical combination of the response lines RSP and presenting data to I/O circuitry 20 corresponding to the results of a combination of special tests. Further, response logic 19 may include storage locations, such as a register, for retaining the results of a sequence of tests together with logic for combining or otherwise communicating the sequence of results to I/O circuitry 20. I/O circuitry 20, in this embodiment, is preferably controlled by timing control circuitry 17 to selective present the output of response logic 19 at input/output terminals DQ in a special test mode.

Various preferred embodiments of the present invention will now be described in detail, for performing diagnostic tests of various functions in memory 1 in the event that the memory is non-functional in a particular manner. These alternative embodiments may be implemented individually or in combination within a particular memory design, depending upon the need for diagnosis of specific circuits, chip area constraints, and the like.

Row Line Failures

Figure 2:
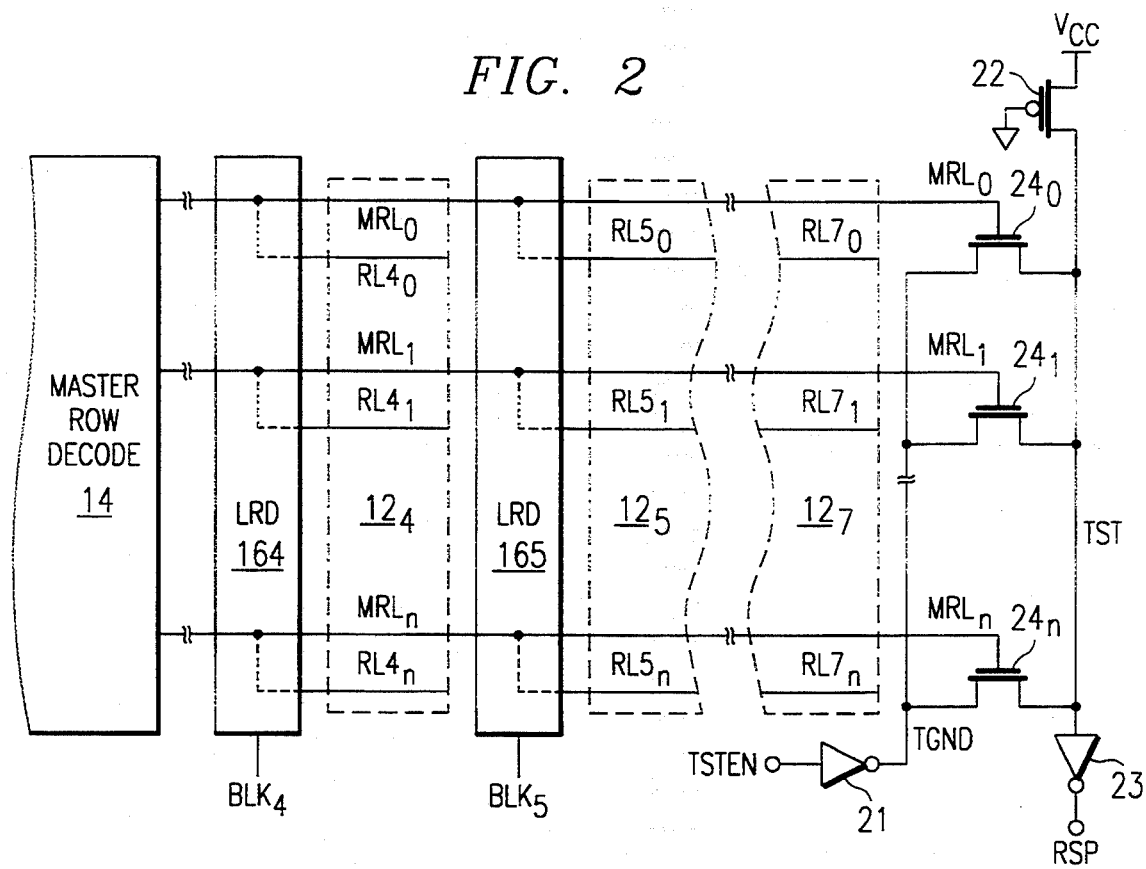
FIG. 2 is an electrical diagram, in block form, of a portion of the memory of FIG. 1 showing the preferred embodiment of the present invention as applied to the testing of global word lines.

Referring now to FIG. 2, the construction and operation of a first embodiment of the present invention will now be described in detail. This embodiment of the invention is directed to the diagnostic testing of memory 1 to determine if a master row line is energized in the operation of memory 1. For example, memory 1 may be operated in a normal operating mode to test the functionality of each memory cell, including whether both data states can be written thereto and read therefrom. If the functional test is successful, one can conclude that all master row lines were energized at the proper time. In the event that such functional testing 1 indicates the presence of failing memory cells, however, such as a row of failing memory cells, the diagnostic test circuitry according to this first embodiment of the invention can indicate whether or not the master row lines were properly energized, and thus provide direct information to the analyst (human or automated) regarding the cause of the failing functional test.

FIG. 2 illustrates master row lines $MRL_0$ through $MRL_n$, each driven by master row decoder 14 and extending across array blocks $12_4$ through $12_7$ of memory 1. As shown in FIG. 2, each master row line $MRL_0$ through $MRL_n$ makes electrical connection to each local row decoder $16_4$ through $16_7$. Each local row decoder 16 receives a corresponding block select line BLKCTRL from block select circuitry (e.g., a portion of column decoder 18) which indicates, when energized, that its associated array block 12 is selected in the current memory cycle. Each local row decoder 16 presents local row lines $RL_0$ through $RL_n$ to its associated array block 12, with each local row line $RL_0$ through $RL_n$ corresponding to one of master row lines $MRL_0$ through $MRL_n$. In a memory operation, the local row decoder 16 associated with the selected array block 12 will energize the one of its local row lines $RL_0$ through $RL_n$ that corresponds to the one of master row lines $MRL_0$ through $MRL_n$ energized by master row line decoder 14. In this way, the row line load seen by master row decoder 14 is no greater than the local row line RL load for a single array block 12, plus the load of the master row line MRL (which is quite low considering that master row lines MRL are not connected to any pass gates).

Test circuitry is provided at the far end of each master row line $MRL_0$ through $MRL_n$ from master row decoder 14, as shown in FIG. 2. P-channel pull-up transistor 22 has its source connected to the $V_{cc}$ power supply, its gate biased to ground, and its drain connected at node TST; alternatively, the gate of transistor 22 may be clocked so as to precharge node TEST prior to the test operation, and then be clocked off when an input is expected during the test operation, so as to operate in the conventional dynamic logic fashion. Each master row line $MRL_0$ through $MRL_n$ is connected to the gate of a corresponding n-channel test transistor $24_0$ through $24_n$ that has its source connected to test ground node TGND and its drain connected to test node TST. Each of test transistors $24_0$ through $24_n$ is preferably larger than pull-up transistor 22 so that any one transistor 24 is able to pull node TST low when turned on (i.e., transistors 22, 24 operate as a ratioed inverter). For example, the width/length ratio of transistor 24 is preferably on the order of 2.0, and that of transistor 22 is on the order of 0.25, so that the drive of a single one of n-channel transistors 24 is on the order of sixteen times that of p-channel transistor 22 (considering the difference in mobility between n-channel and p-channel devices). Test enable input TSTEN is connected to the input of inverter 21 which has its output connected to node TGND; similarly, node TST is connected to the input of inverter 23 which drives response node RSP at its output.

In operation, a functional test is first preferably performed on memory 1 in normal operating mode (or in a conventional special test mode such as parallel test), during which node TSTEN will remain low. During this functional test, none of transistors $24_0$ through $24_n$ will conduct, as a high ($V_{cc}$) voltage will be present at both the sources and drains thereof. In addition, since in this embodiment of the invention the source and drain of the test transistor 24 are at $V_{cc}$ during normal operation, and since the master row line MRL for the selected row is driven high, the capacitive load of test transistor 24 on the transition of the master row line MRL is minimal; as such, the performance degradation resulting from the provision of the test circuitry of the present embodiment of the invention is slight.

Alternatively, the test circuitry of this embodiment of the invention may be implemented with complementary and opposite bias conditions for test transistors 24 if master row lines MRL are energized with a low logic level. In this case, test transistors 24 would be p-channel transistors, with their sources biased to a switched test $V_{cc}$ level (in special test) or to ground (in normal operation), and their drains biased to ground.

If all memory locations are functional, there will be no need for the test circuitry of transistors 22, 24 to operate, as one may conclude that all master row lines MRL are functional. If the functional test indicates that certain memory cells cannot be accessed, a special test mode is then entered to determine if the corresponding master row lines MRL can be fully energized. This special test may be performed for each row address of memory 1 in sequence; alternatively, if only certain memory locations fail, only those row addresses corresponding to the failing locations need be presented in the special test. Upon entry into special master row line test mode, test enable input TSTEN is driven with a high logic level during a memory cycle, preferably by timing and control circuitry 17. The high level on line TSTEN drives test ground node TGND low, via inverter 21, presenting a ground voltage to the source of each of test transistors 24. Also at this time, pull-up transistor 22 pulls test node TST initially to a voltage at or near $V_{cc}$, placing response node RSP in a low initial condition (through inverter 23).

Once node TGND is biased low by inverter 21 in this special test mode, the successful energizing by master row decoder 14 of one of master row lines $MRL_0$ through $MRL_n$, along its full length, will cause the corresponding one of test transistors $24_0$ through $24_n$ to be turned on. This will pull test node TST low, causing response node RSP to be driven high by inverter 23. Response node RSP is preferably forwarded to response logic 19, as discussed above relative to FIG. 1, prior to its application to input/output terminal DQ; alternatively, response node RSP may be directly coupled to an input/output terminal DQ of memory 1 to indicate the result of the test.

Conversely, if response node RSP remains at a low logic level after performing a memory cycle in this special test mode, none of transistors $24_0$ through $24_n$ were turned on during the memory cycle. This condition indicates that the cause of the functional test failure may be due to master row decoder 14 being defective, or to the master row line MRL that was to be energized being open somewhere along its length.

This embodiment of the invention therefore provides indication of whether a master row line MRL was fully energized during a memory operation. This specific indication assists the analyst in narrowing down the reason for the failure of the functional test by memory 1. It is contemplated that this information may be provided to a human analyst that is specifically interrogating or analyzing the particular sample of memory 1 having the failure. Alternatively, especially if memory 1 has the capability of entering various special test modes, it is contemplated that the special diagnostic test of master row lines MRL according to this embodiment of the invention can be performed in an automated manner by the memory test equipment. For example, a special test block of the test program may be conditionally performed, in the event of a functional failure of the memory under test.

As noted above, failure of the special test may indicate either that the selected master row line MRL contains an open, or that master row decoder 14 is defective for that row address, as test transistors 24 are located at the distal end of master row lines MRL. If chip area permits, additional test transistors may be similarly placed at the outputs of master row decoder 14 ahead of master row lines MRL, so that the analyst would be provided sufficient information to distinguish an open master row line failure from a decoder failure.

Figure 3:
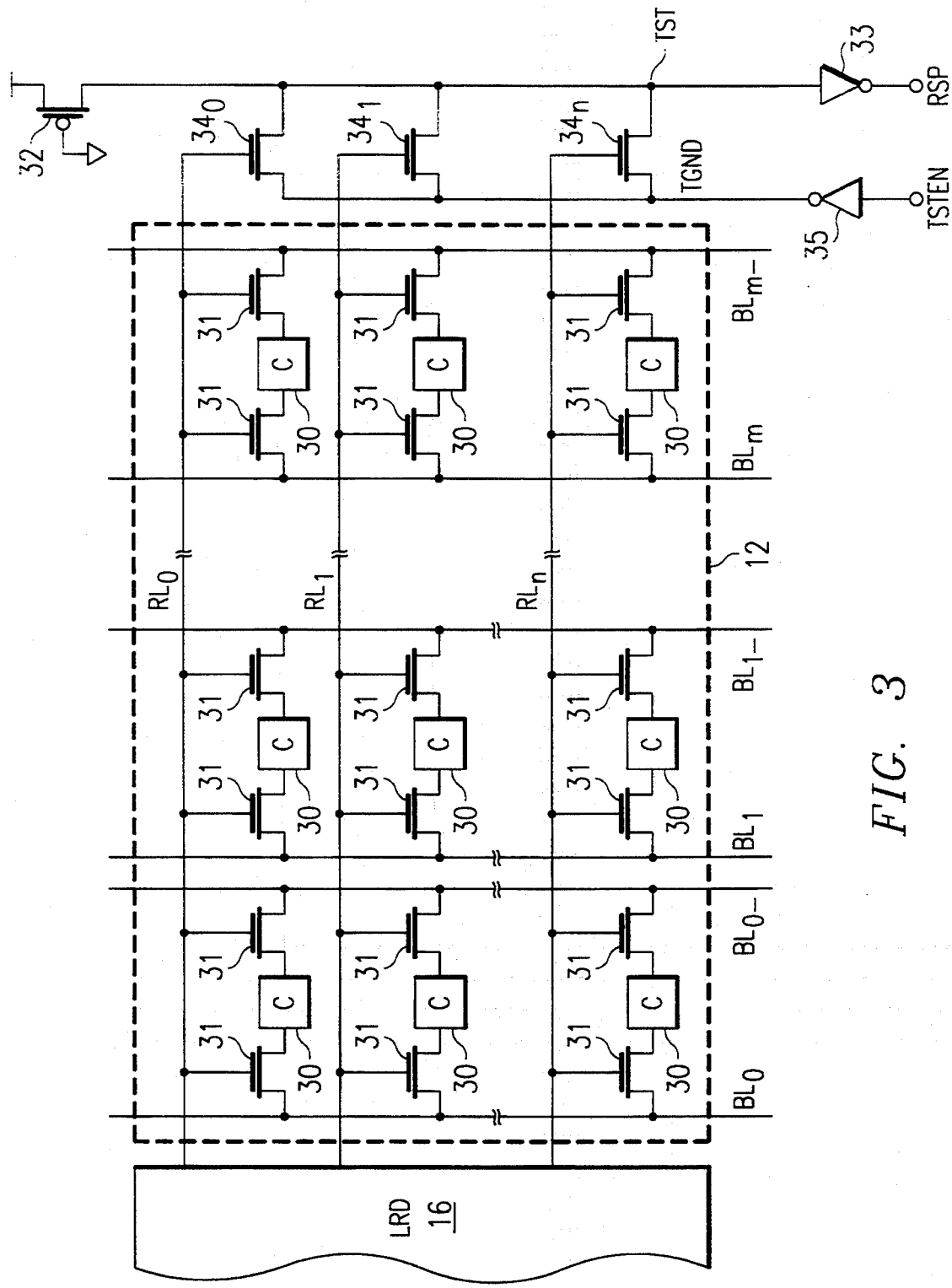
FIG. 3 is an electrical diagram, in schematic and block form, of a portion of the memory of FIG. 1 showing the preferred embodiment of the present invention as applied to local word lines.

Referring now to FIG. 3, a second preferred embodiment of the present invention will now be described, relative to the testing of local row lines in memory 1. It will be appreciated that the embodiment of FIG. 3 is also applicable to the testing of row lines in conventional semiconductor memories that include only a single level of row decoders, as opposed to the master/local hierarchy described hereinabove.

As shown in FIG. 3, local row decoder 16 drives local row lines $RL_0$ through $RL_n$, as before. In this example, memory cells 30 are arranged in n rows and m columns within array block 12, in the conventional manner. Each memory cell 30 in this example is a conventional SRAM cell, such as of the 4-T, 2-R type, or of the 6-T type, depending upon the manufacturing technology used. Each column of array block 12 is defined by a differential (or complementary) pair of bit lines BL, BL_. Of course, the present invention may also be applied to memories of different memory cell type (including EPROM, EEPROM, EAROM, ROM, DRAM, etc.), and also to memories having only single bit lines per column (e.g., DRAMs). In the SRAM example of memory 1, the complementary cross-coupled nodes of each cell 30 are coupled to differential bit lines BL, BL in its column by way of pass transistors 31. The gates of pass transistors 31 are controlled by the local row line RL associated with the row in which the particular memory cell 30 is located.

In operation, as is well known, local row decoder 16 energizes the one of its local row lines RL that corresponds to the row address, and will maintain all of the other local row lines RL at a de-energized state. Accordingly, those pass transistors 31 in the selected row will be turned on, coupling their associated memory cells 30 to bit lines $BL_0$, $BL_0$_, through $BL_m$, $BL_m$_, for all of the columns of array block 12. The bit line pairs BL, BL_ associated with the selected column(s) indicated by the column address will be coupled to sense/write circuits 13, for sensing or writing, depending upon the desired operation, in the conventional manner.

According to this preferred embodiment of the invention, each local row line RL is connected to the gate of an associated test transistor 34, at its distal end relative to local row decoder 16. Each test transistor $34_0$ through $34_n$ has its source connected to test ground node TGND and its drain connected to test node TST. As in the embodiment of FIG. 2, test ground node TGND is driven by test enable node TSTEN via inverter 35; if implemented in combination with the master row line testing of FIG. 2, test enable node TSTEN may be either be electrically connected to the similarly named node in the embodiment of FIG. 2, or may be a separately generated node, as desired. Test node TST is biased to $V_{cc}$ via small (relative to transistors 34) p-channel pull-up transistor 32 having its source-drain path connected between $V_{cc}$ and node TST and its gate biased to ground; alternatively, and as noted above, the gate of transistor 32 may be clocked so that the circuitry of FIG. 3 operates in dynamic precharge/discharge fashion. Test node TST is connected to the input of inverter 33 which drives response node RSP at its output.

The operation of the embodiment of FIG. 3 is similar to that of FIG. 2, previously described. In the event that a functional test fails, a special test mode is entered by way of which line TSTEN is driven high, pulling test ground node TGND to ground. Any of the local row lines $RL_0$ through $RL_n$ that are energized along its full length will turn on its associated test transistor $34_0$ through $34_n$ to pull test node TST to ground (i.e., to the voltage of test ground TGND). This condition will be reflected by a high level at response node RSP, driven by inverter 33, to indicate that a local row line RL was fully energized in the memory cycle. Conversely, response node RSP remaining at a low logic level upon completion of the special test cycle will indicate that no local row line RL was fully energized along its length, as test node TST was not pulled low. In either event, the test circuitry according to this embodiment of the invention will provide direct results of the internal operation of the memory to the human or automated analyst, for use in determining the cause of functional failure.

As in the embodiment of FIG. 2, the source and drain of each of test transistors 34 are both biased to $V_{cc}$ during normal operation (i.e., node TSTEN being low). As a result, the capacitive load added to local row lines RL by test transistors 34 is quite small, so the effect of the test circuitry according to this embodiment of the invention on device performance is minimal. In addition, as noted above, an additional set of test transistors may also be placed at the outputs of local row decoder 16, if chip area permits, distinguishing an open local row line failure from a decoder failure.

Figure 4:
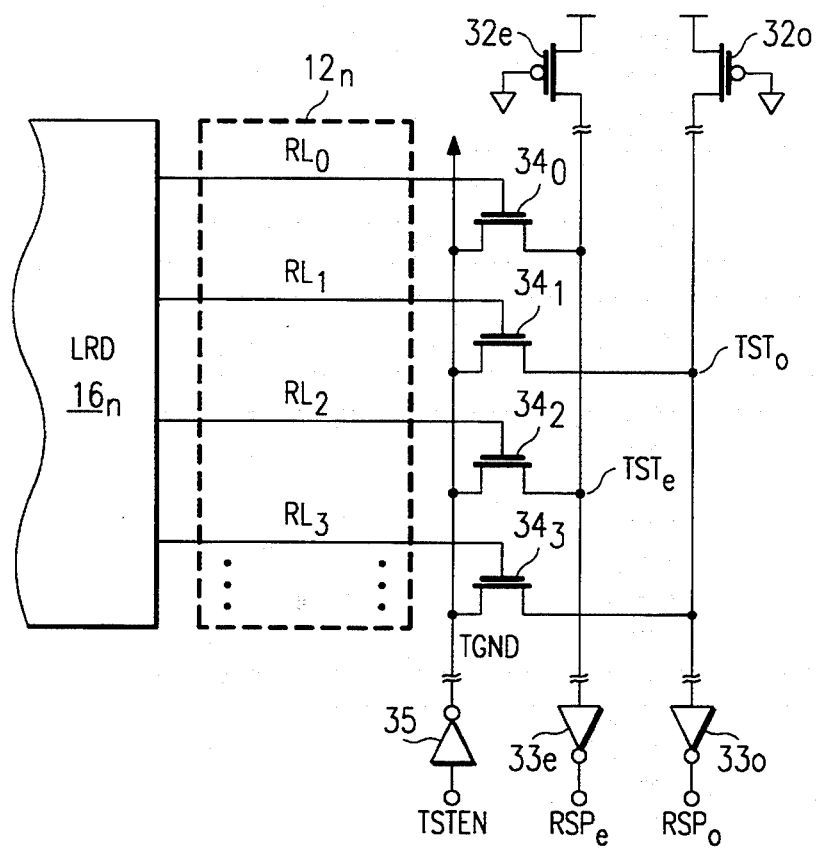
FIG. 4 is an electrical diagram, in schematic and block form, of a portion of the memory of FIG. 1 showing the preferred embodiment of the present invention as applied to local word lines in an alternative manner.

In each of the embodiments of FIGS. 2 and 3, while a positive result from the special row line test indicates that at least one row line (master or local, as the case may be) was energized along its full length, this arrangement does not directly indicate failures due to the erroneous energizing of multiple row lines, such as may occur if a short circuit between adjacent row lines is present, resulting in functional failure due to data conflicts on selected bit lines BL, BL_ in normal operation. According to the present invention, however, since the time required to discharge test node TST to ground depends upon the drive of the test transistor(s) 24, 34 that are turned on, a measurement of the time response of response node RSP after the presentation of the row address signal will indicate whether multiple row lines were energized during the test. The sizes of transistors 22, 24 (or 32, 34) may be ratioed appropriately, with the appropriate capacitance added to node TST, to provide adequate differentiation in the response time between a single row line being energized and multiple row lines being energized.

Where chip area permits, however, it is desirable to provide a direct indication of whether multiple row lines (master or local) were energized in a memory cycle. Referring now to FIG. 4, another alternative embodiment of the present invention that directly indicates the energizing of adjacent local row lines in a single cycle will now be described in detail for the case of local row lines, it being understood that a similar approach may be applied to master row lines MRL as in the case of FIG. 2.

According to this embodiment of the invention, each of local row lines RL are connected to the gates of corresponding test transistors 34, as in the embodiment described hereinabove relative to FIG. 3, and the sources of all test transistors 34 are connected in common to test ground node TGND driven by inverter 33 responsive to test enable node TSTEN. In order to distinguish the condition of adjacent local row line shorting, however, the drains of even-numbered ones of test transistors 34 (i.e., transistors $34_0$, $34_2$, etc.) are connected to even test node TSTe, while the drains of odd-numbered ones of test transistors 34 (i.e., transistors $34_1$, $34_3$, etc.) are connected to odd test node TSTo. Even and odd test nodes TSTe, TSTo are biased to $V_{cc}$ by small even and odd p-channel pull-up transistors 32e, 32o, respectively, and are connected to the inputs of inverters 33e, 33o, respectively, which in turn drive even and odd response nodes RSPe, RSPo, respectively. As noted above, transistors 32e, 32o may be biased on, as shown, or clocked to precharge their respective even and odd test nodes TSTe, TSTo.

The operation of the embodiment of FIG. 4 is identical to that of the embodiment of FIG. 3, in that the special test cycle is performed with test enable input TSTEN driven high to drive test ground node TGND low. Even and odd response nodes RSPe, RSPo indicate with a high logic level, in this example, whether an even-numbered or an odd-numbered local row line RL, respectively, was energized in the special test cycle. Comparison of the state of response nodes RSPe, RSPo with the desired row address will determine if the proper local row line RL was energized. If adjacent local row lines RL are shorted together at some location along their length or by operation of local row decoder 16, though, both response nodes RSPe, RSPo will be at a high level as a result of a special test cycle. Accordingly, the embodiment of FIG. 4 will provide additional failure analysis information to the analyst, further assisting the diagnosis of the cause of failure.

The even and odd adjacent relationship of adjacent row lines RL need not be both physical and topological (i.e., adjacent addresses but not physically adjacent) for important information to be provided by this embodiment of the invention. Indeed, additional diagnostic information would be provided if adjacency of row lines were only of one type. This is because detection of topologically adjacent but not physically adjacent row lines being simultaneously energized would indicate a decoder failure; conversely, detection of the simultaneous energizing of physically adjacent but not topologically adjacent row lines would indicate a row line short condition.

Alternatively to the decoded response lines in the embodiment of FIG. 4, the same information may be provided by a single response line RSP for both even-numbered and odd-numbered row lines RL in combination with the even and odd decoded test enable input nodes TSTEN coupled to even-numbered and odd-numbered test ground nodes. In this case, if a high level is driven at the single response node for the same row address regardless of which test enable input node is driven high, the analyst may conclude that adjacent local row lines are shorted together.

Further in the alternative to the embodiment of FIG. 4, test nodes TST or test ground nodes TGND may be decoded in groups of four or larger, to provide further indication of the location of the open or short condition.

Figure 5:
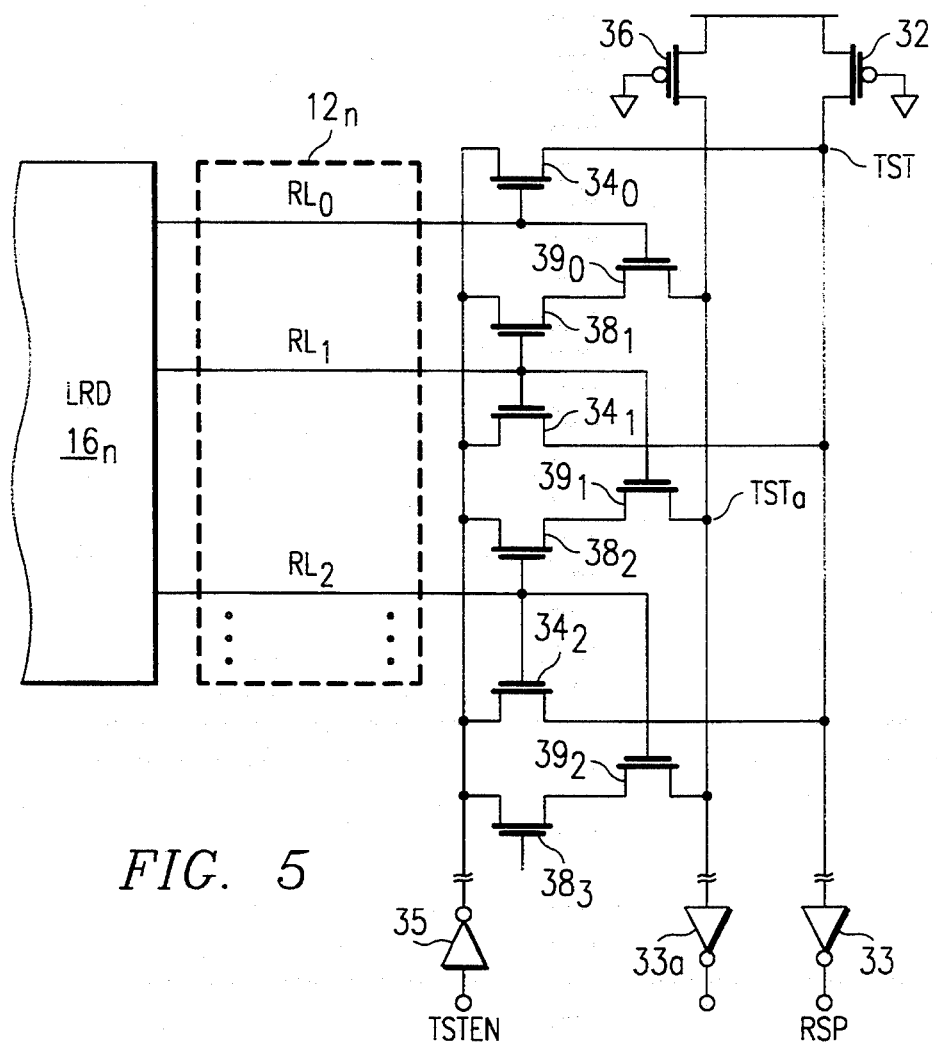
FIG. 5 is an electrical diagram, in schematic and block form, of a portion of the memory of FIG. 1 showing the preferred embodiment of the present invention as applied to local word lines in another alternative manner.

Referring now to FIG. 5, another alternative embodiment of the present invention is illustrated which provides further information regarding multiple row line failures. Again, while FIG. 5 is presented relative to local row lines, a similar arrangement will of course apply to master row lines, if utilized. In the arrangement of FIG. 5, each local row line RL is connected to the gate of corresponding test transistor 34, with each test transistor 34 having its source-drain path connected between test ground node TGND and test node TST, as in the case of the embodiment of FIG. 3. Test ground node TGND is driven by test enable node TSTEN via inverter 35, and test node TST is biased to $V_{cc}$ through small pull-up transistor 32, as before. Transistor 32 may be biased on, as shown in FIG. 5, or alternatively may be clocked to precharge node TST prior to the test operation. Response node RSP is driven by inverter 33 according to the state of test node TST, to indicate whether one or more of local row lines RL are energized along its full length, as in the case of the embodiment of FIG. 3.

In addition, however, each local row line RL also drives the gate of one or more transistors 38, 39 in a ratioed NAND function with each of its adjacent local row lines RL. As shown in FIG. 5, local row line $RL_0$ is connected to the gate of transistor $39_0$ and its adjacent local row line $RL_1$ is connected to the gate of transistor $38_1$, where the source/drain paths of transistors $39_0$, $38_1$ are connected in series between test ground node TGND and adjacent test node TSTa; adjacent test node TSTa is biased to $V_{cc}$ by p-channel pull-up transistor 36, which has its gate biased to ground (or is alternatively clocked so as to precharge adjacent test node TSTa, if dynamic logic operation is desired). Transistors $39_0$, $38_1$ and 36 thus comprise a ratioed NAND function so that, when test ground node TGND is driven low by inverter 35 in special test mode, the logic level at adjacent test node TSTa corresponds to the logical NAND of the states of the distal ends of local row lines $RL_0$, $RL_1$. Similarly, since local row line $RL_1$ is also adjacent to local row line $RL_2$, local row line $RL_1$ is connected to the gate of transistor $39_1$ and adjacent local row line $RL_2$ is connected to the gate of transistor $38_2$, where the source/drain paths of transistors $39_1$, $38_2$ are connected in series between test ground node TGND and adjacent test node TSTa.

In operation, during a special test mode in which test enable node TSTEN is driven to a high logic level and test ground node TGND is at ground, the state of response node RSP indicates whether one or more of local row lines RL are energized along its full length, as in the embodiment of FIG. 3. If any two adjacent local row lines $RL_i$, $RL_{i+1}$ are both energized along their full lengths, however, adjacent test node TSTa will also be pulled to ground through the operation of the ratioed NAND function of transistors $38_{i+1}$, $39_i$. This condition will be reflected by a high logic level at adjacent response node RSPa, driven by inverter 33a.

The embodiment of FIG. 5 thus will indicate the simultaneous energizing of any two adjacent local row lines RL, in a manner that provides additional certainty relative to the embodiment of FIG. 4, in which the energizing of any odd row line and any even row line, regardless of adjacency, would be indicated.

It is contemplated that other variations and combinations of the row line test arrangements described herein relative to FIGS. 2 through 5 will be apparent to those of ordinary skill in the art, having reference to this specification. As noted above, various ones of these techniques may be used in combination, especially in architectures such as memory 1 of FIG. 1 which utilizes the master/local row line hierarchy.

Control Signal Integrity Diagnosis

Figure 6:
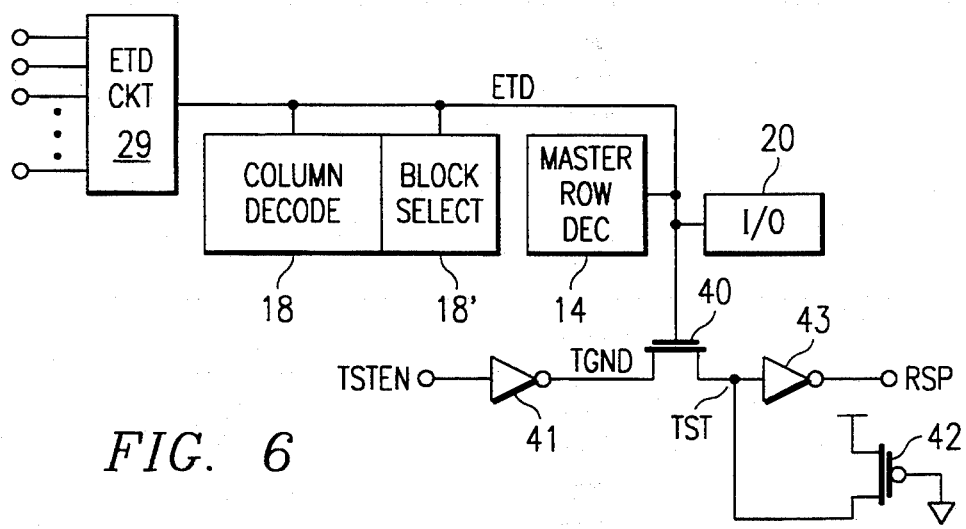
FIG. 6 is an electrical diagram, in block form, of a portion of the memory of FIG. 1 showing the preferred embodiment of the present invention as applied to a control signal, for example an edge transition detection signal.

It is also contemplated that the present invention may also be applied to other control signals in memory 1, including such signals that are not the result of address decoding. Referring now to FIG. 6, an embodiment of the invention applied to such a control signal, for example a signal indicating the detection of a logic transition at one or more input terminals of memory 1, will now be described in detail.

FIG. 6 illustrates edge transition detection (ETD) circuit 29, which receives a number of signals from input terminals of memory 1, such as address inputs and data inputs. As is conventional in the art, ETD circuit 29 generates a pulse at its output, coupled in this example to line ETD, which indicates that a logic level transition has been detected at one or more of the monitored inputs. An example of the construction and operation of ETD circuit 29 is described in U.S. Pat. No. 5,124,584, issued Jun. 23, 1992, assigned to SGS-Thomson Microelectronics, Inc. and incorporated herein by reference. As is known in the art, the transition pulse on line ETD is commonly used to initiate a memory cycle in static memories such as SRAMs, EPROMs and the like.

As shown in FIG. 6, line ETD is connected to many circuit blocks within memory 1, including column decode 18, block select decoder 18' (which may be implemented as part of column decode 18), master row decoder 14, I/O circuitry 20, and the like, to control the operation of these circuit blocks upon initiation of a memory cycle. Of course, other functions within memory 1 may similarly be controlled by the pulse on line ETD, or a timing signal derived therefrom. As such, control line ETD is likely to run for some distance within the integrated circuit chip containing memory 1, either directly or through buffering, delay lines, gates and the like.

According to this embodiment of the invention, the distal end of control line ETD is connected to the gate of n-channel test transistor 40. The source of transistor 40, at test ground node TGND, is driven by inverter 41 responsive to the state of test enable node TSTEN. At test node TST, the drain of transistor 40 is connected to the input of inverter, which drives response node RSP at its output, and is also biased to $V_{cc}$ through small p-channel pull-up transistor 42, which has its gate biased to ground (as shown) or clocked to precharge test node TST. The arrangement of test transistor 40 and pull-up transistor 42 is thus similar to that for the row line test circuitry described hereinabove.

During normal operation, such as during a functional test, line TSTEN remains at a low logic level, so that inverter 41 is driven high. Since both the source and drain of test transistor 40 at nodes TGND, TST, respectively, are biased high, transistor 40 will not turn on responsive to line ETD being driven high by ETD circuit 29 in the initiation of a memory cycle; in addition, the capacitive load presented to the low-to-high transition of line ETD is relatively low, as a result of this bias condition. Response node RSP will remain at a low logic level during normal operation, because node TST will remain at a high logic level.

In the event of a functional failure, the function of ETD circuit 29 and the integrity of line ETD may be interrogated by performing a special test operation. This special test is initiated with test enable node TSTEN is driven high by timing control circuitry 17, as described in the prior embodiments, pulling test ground node TGND low. If the ETD circuit 29 operates properly and line ETD is not open anywhere along its length, line ETD will turn on test transistor 40 with the ETD pulse that is produced responsive to the detection of an input transition. Test transistor 40 and pull-up transistor 42 operate as a ratioed inverter, with test transistor 40 pulling test node TST low responsive to the ETD pulse at its gate, causing inverter 43 to drive response node RSP high and communicate a successful operation to response logic 19. The high level at response node RSP will correspond to the duration of the ETD pulse, as pull-up transistor 42 will return test node TST high upon the completion of the ETD pulse after transistor 40 is turned off again. Alternatively, a latch may be provided that receives the pulse at response node RSP, to retain an indication of whether the test was successful after the end of the ETD pulse.

Conversely, if either ETD circuit 29 is non-functional, or if line ETD is open along its length, response node RSP will remain low, since transistor 40 will not turn on, indicating a defect in the generation or distribution of the ETD pulse. Other failure conditions may also be reflected in the behavior of response node RSP, including a short circuit between line ETD and a high voltage such as $V_{cc}$ (reflected in response node RSP remaining high throughout the test), or a short circuit between line ETD and ground (reflected in slow response of response node RSP to the ETD pulse).

It will of course be understood by those of ordinary skill in the art having reference to this specification that other control signals may be tested in similar fashion as that shown for the exemplary signal of line ETD. Examples of such signals include clock signals, predecoded address signals, and the like. In addition, test transistors may be provided along the length of such control signals, and not only at the distal ends from the driving circuitry, to provide additional information regarding the operation of the control signal and the location of a possible defect, if chip area permits. It will of course also be understood that the present invention may be implemented in complementary fashion, i.e., with p-channel sensing and n-channel loads.

Figure 7:
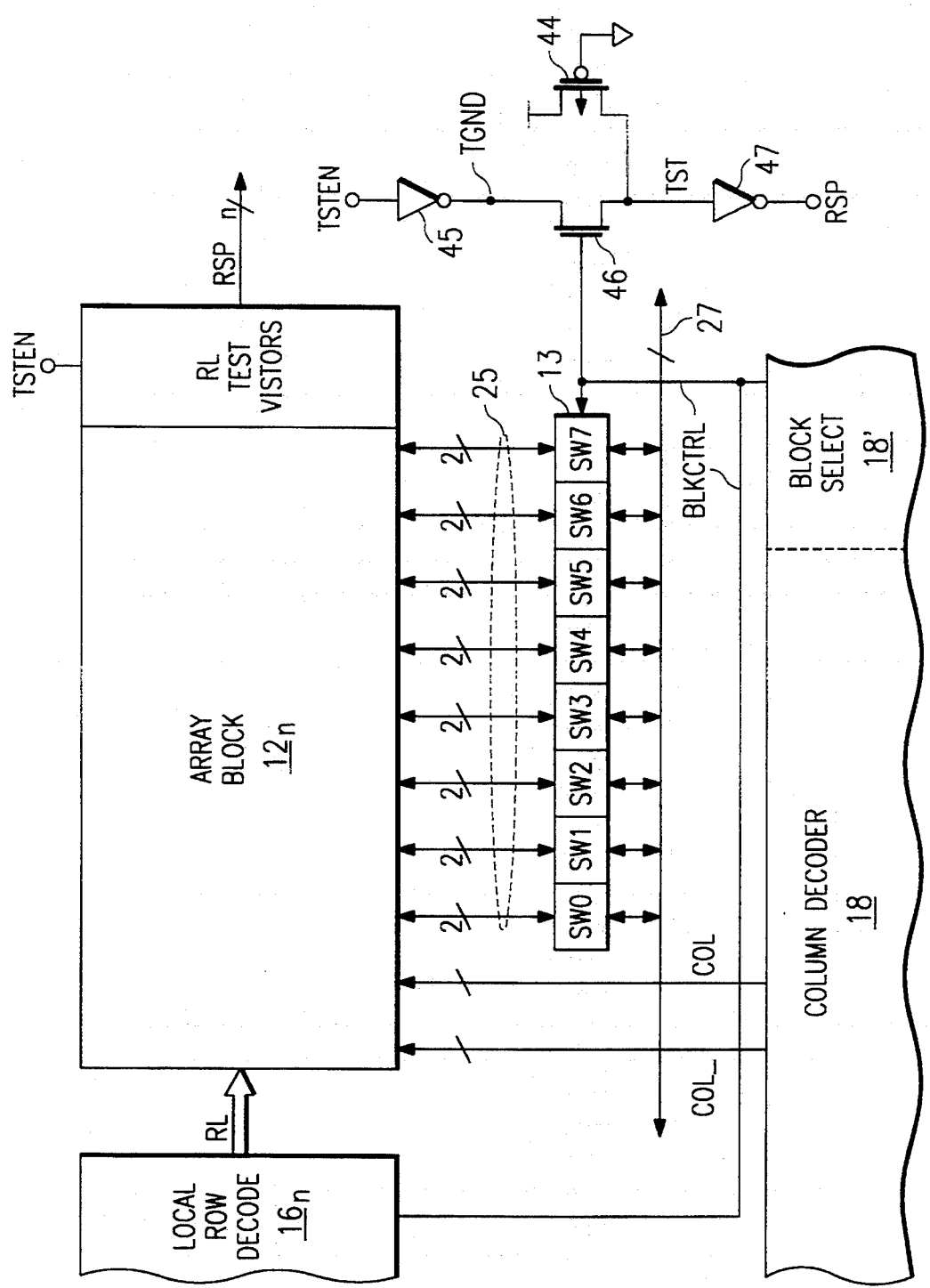
FIG. 7 is an electrical diagram, in block form, of a portion of the memory of FIG. 1 showing the preferred embodiment of the present invention as applied to a block select signal.

Referring now to FIG. 7, another embodiment of test circuitry for testing the operation of block select control signal in memory 1 according to the present invention will now be described. As noted above, memory cells 30 in memory 1 are arranged in multiple array blocks 12 in such a manner that the selected memory cells 30 in a cycle are resident within the same array block 12. As such, block select 18' of FIG. 7 decodes at least one of the column address bits, in this example, to determine which array block 12 is to be selected in a memory cycle, and generates a block select signal on line BLKCTRL accordingly. The block select signal enables, among other things, local row decoder 16 and sense/write circuits 13 (SW0 through SW7) associated with the selected array block 12, as shown in FIG. 7.

The arrangement of FIG. 7 also illustrates the relationship of column decoder 18 with a selected array block $12_n$ and its sense/write circuits $13_n$. Column decoder 18 presents column select signals on complementary buses COL, COL_, which have m/8 lines each for the m columns in array block 12 (for the by-eight organization of memory 1). Bit lines BL, BL_ for the selected columns are then placed in communication with sense/write circuits SW0 through SW7 via differential data lines 25, for sensing of the data states thereon or writing of data thereto, as the case may be. Sense/write circuits 13 are, in turn, in communication with I/O circuitry 20 via I/O bus 27. Of course, other organizations of sense/write circuits $13_n$ relative to array block $12_n$ may also utilize the present invention.

According to this embodiment of the invention, block select line BLKCTRL is connected to the gate of n-channel test transistor 46. The source of transistor 46 at test ground node TGND is driven by inverter 45, which has its input connected to test input TSTEN. The drain of transistor 46 is at test node TST, which is biased to $V_{cc}$ through small p-channel pull-up transistor 44 having its gate biased to ground (or, alternatively, clocked to precharge test node TST); test node TST is also connected to the input of inverter 47, which has response node RSP connected to its output.

As in the previously-described embodiments, test enable node TSTEN is held low in normal operating mode, so that $V_{cc}$ is present on both the source and drain of transistor 46. A high enabling level on line BLKCTRL is thus not appreciably loaded by transistor 46, resulting in little performance degradation. In order to test the functionality of block select 18' and the integrity of line BLKCTRL, line TSTEN is driven high to place a ground voltage at test ground TGND. If block select 18' and line BLKCTRL are in proper condition, transistor 46 will be turned on with selection of array block $12_n$. Since transistors 46, 44 operate as a ratioed inverter, the selection of array block $12_n$ will pull test node TST to ground (i.e., to the potential of test ground TGND), presenting a high logic level at response node RSP for communication to response logic 19. Conversely, if a fault such as an open circuit is present in block decode 18' or line BLKCTRL, transistor 46 will not turn on, and response node RSP will remain at a low logic level. In this way, the circuitry according to this embodiment of the invention also has the result of directly indicating the functionality of a specific circuit block within memory 1.

Figure 8:
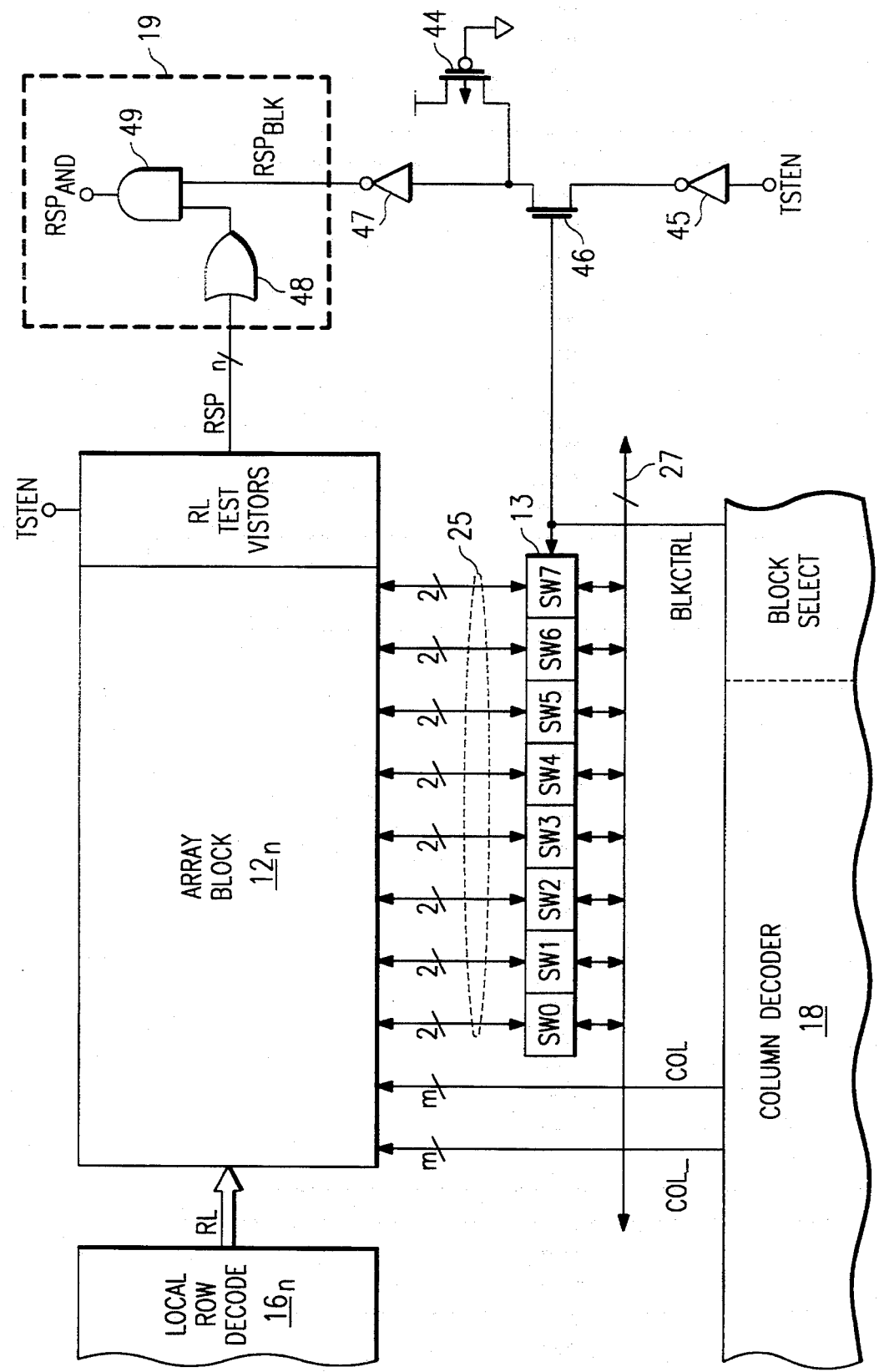
FIG. 8 is an electrical diagram, in block form, of a portion of the memory of FIG. 1 showing the preferred embodiment of the present invention as applied to a block select signal in an alternative manner, in combination with the testing of local word lines.

Especially in the event that the functional test determines that the failing memory locations are present in a single array block 12, it is desirable to test the combination of the block select functionality of FIG. 7 with the energizing of a row line in array block 12, thus providing an indication of whether the proper array block 12 was addressed. FIG. 8 illustrates an alternative embodiment of the present invention, in which the control signal test circuitry of FIG. 6 is combined with circuitry for testing the integrity of local row lines. Accordingly, the embodiment of FIG. 8 includes the circuitry of FIG. 7 for testing the operation of block select 18' and the integrity of block select control line BLKCTRL, in combination with circuitry for testing the selection and integrity of local row lines as described hereinabove relative to FIG. 3.

In this example, the n outputs of the row line test transistor circuits 24 (for the n rows of array block $12_n$) are each connected to an input of a logical OR function represented by OR gate 48 in FIG. 8. It is of course contemplated that OR gate 48 represents an OR function and, considering the number of inputs thereto, will likely not be implemented as a single conventional OR gate, but will rather be implemented as a wired-OR or a series of OR functions, as known in the art. The output of OR function 48 is connected to an input of AND gate 49, which receives the output of inverter 47 on line $RSP_{BLK}$ at another input. Referring back to FIG. 1, OR function 48 and AND gate 49 of FIG. 7 are an example of logical operations performed by response logic 19. The output of AND gate 49 presents line $RSP_{AND}$ which indicates, when high, that the block select test (via test transistor 46) was successful such that array block $12_n$ was selected, and that at least one row line RL in array block was energized. According to this embodiment of the invention, therefore, logical combinations of special test circuitry are performed to allow the analyst to more specifically detect the internal operation of memory 1.

Bit Line Operation Diagnosis

Figure 9:
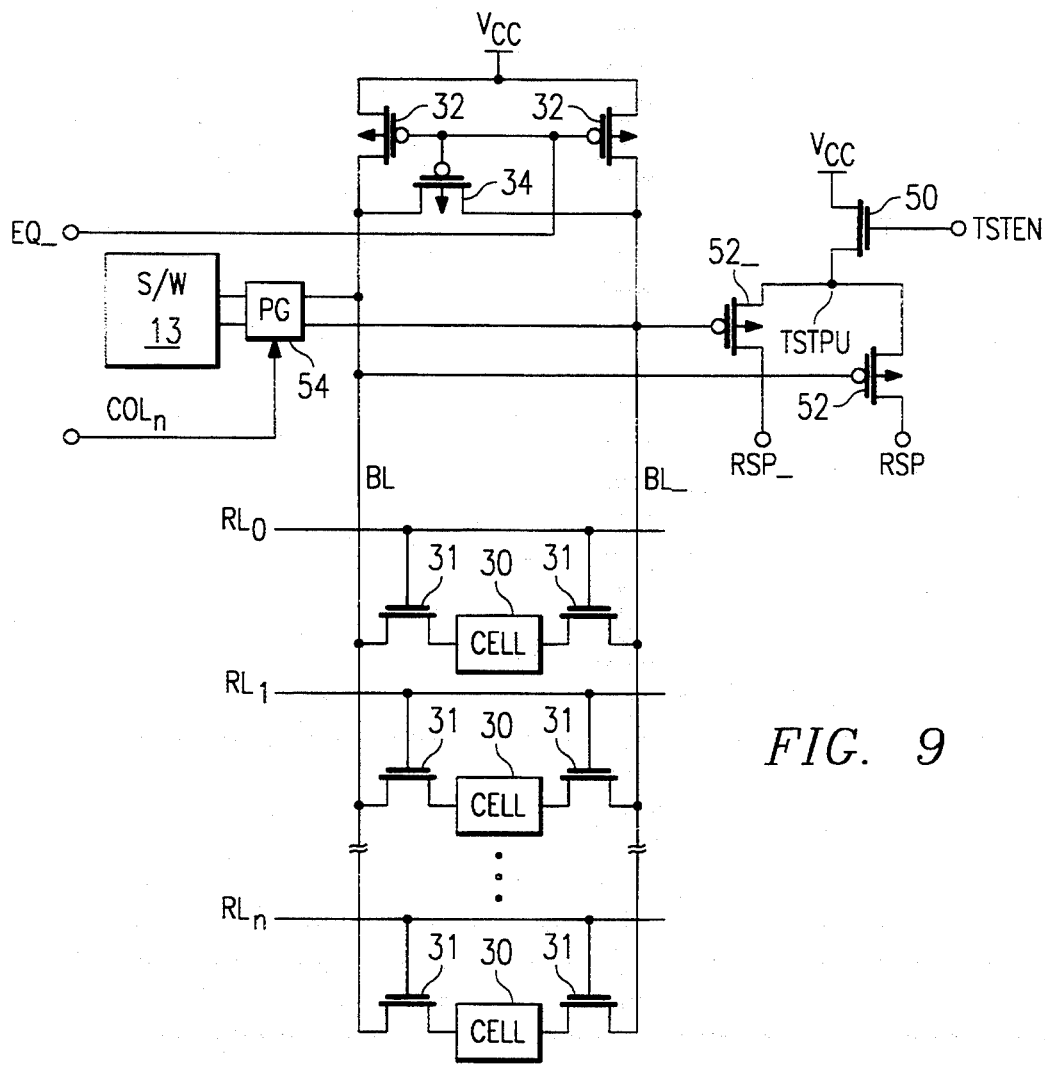
FIG. 9 is an electrical diagram, in schematic form, of a portion of the memory of FIG. 1 showing the preferred embodiment of the present invention as applied to bit lines in a column of the memory.

Referring now to FIG. 9, another alternative embodiment of the invention, directed to testing the operation and integrity of bit lines within array blocks 12 of memory 1, will now be described in detail relative to an exemplary column. FIG. 9 illustrates a column of memory cells 30 in array block 12. As described above, each memory cell 30 is coupled to differential bit lines BL, BL__ via pass gates 31 controlled by row lines $RL_0$ through $RL_n$, one of which is energized responsive to the row address value. Each of bit lines BL, BL__ are connected to pass gate 54, which is controlled by a column select signal on line $COL_m$; when a column is selected, its line $COL_m$ is driven high, coupling bit lines BL, BL__ to sense/write circuit 13.

According to this preferred embodiment of the invention, test circuitry is implemented on bit lines BL, BL__ to allow direct testing of the integrity thereof. In this example, bit lines BL, BL__ both generally remain near $V_{cc}$ when their columns are not selected. During a write operation to the column, one of bit lines BL, BL__ is pulled low by sense-write circuit 13 to the input data state to be written.

The special test circuitry according to this embodiment of the invention will now be described. Bit line BL is connected to the gate of p-channel test transistor 52, while bit line BL__ is connected to the gate of p-channel test transistor 52__. The drains of transistors 52, 52__ correspond to response nodes RSP, RSP__, respectively, which are connected as open-drain inputs to response logic 19. Alternatively, it may be desirable to provide small pull-down devices between response nodes RSP, RSP__, with response nodes RSP, RSP__ driving conventional static logic. The sources of transistors 52, 52__ at node TSTPU are connected to the source of n-channel pull-up transistor 50, which has its drain connected to $V_{cc}$ and its gate controlled by line TSTEN.

Line TSTEN is low during normal operation, maintaining transistor 50 off so that transistors 52, 52__ do not affect the voltage at response nodes RSP, RSP__. It may be desirable to ground nodes TSTPU, RSP, RSP__ during normal operation, to reduce the capacitive load on bit lines BL, BL__.

In the special test mode for testing the integrity of bit lines BL, BL__, line TSTEN is driven high to turn on transistor 50, charging node TSTPU to a voltage of approximately $V_{cc}-V_{tn}$, where $V_{tn}$ corresponds to the threshold voltage of n-channel transistor 50. A write operation is then performed to one of memory cells 30 in the selected column by driving a low logic level on the one of bit lines BL, BL__ to be tested in that cycle. If bit line BL is to be tested, sense/write circuit 13 writes a "zero" to a memory cell 30 in the column by pulling bit line BL to ground through pass gate 54 while leaving bit line BL__ high; conversely, if bit line BL__ is to be tested, sense/write circuit 13 writes "one" a to a memory cell 30 in the column by pulling bit line BL__ low.

During the write cycle in this special test mode, as the voltage of the one of bit lines BL, BL__ under test falls to the voltage $V_{cc}-(V_{tn}+V_{tp})$, where $V_{tp}$ is the threshold voltage of one of transistors 52, 52__, the corresponding transistor 52, 52__ will turn on, driving the corresponding node RSP, RSP__ to a high logic level (i.e., to the voltage $V_{cc}-V_{tn}$ of node TSTPU). The states of response nodes RSP, RSP_ are received by response logic 19 and compared against the data desired to be written in that cycle, to determine whether the response at nodes RSP, RSP_ indicates a successful or unsuccessful bit line write.

As described hereinabove for the other embodiments, logical combinations of the response nodes RSP, RSP_ may be made by response logic 19, or alternatively prior to applying the response nodes to response logic RSP, RSP_. For example, one may rely on the complementary operation of bit lines BL, BL_ by performing the logical OR of response nodes RSP, RSP_, thus reducing the number of response lines required. Alternatively, the test enable signal at line TSTEN may be decoded, so that only one or more selected columns may be tested in this way. The decoding of the source transistor also allows for fewer response lines to be routed in memory 1.

For multiple I/O memories such as memory 1 described hereinabove, it is of course useful to test the bit lines for each of the columns selected for a given column address in this manner. Similar circuitry to that of transistors 50, 52 may also be applied to each of the input/output bus lines in I/O bus 27. Accordingly, for a by-eight memory such as memory 1, it is preferable to interrogate sixteen response nodes in each cycle, including eight bit line responses (for the expected data state) and eight I/O line responses. Alternatively, the number of response nodes and lines to response logic 19 may be reduced by decoding the signal applied to the gate of the source transistor (e.g., transistor 50).

Figure 10:
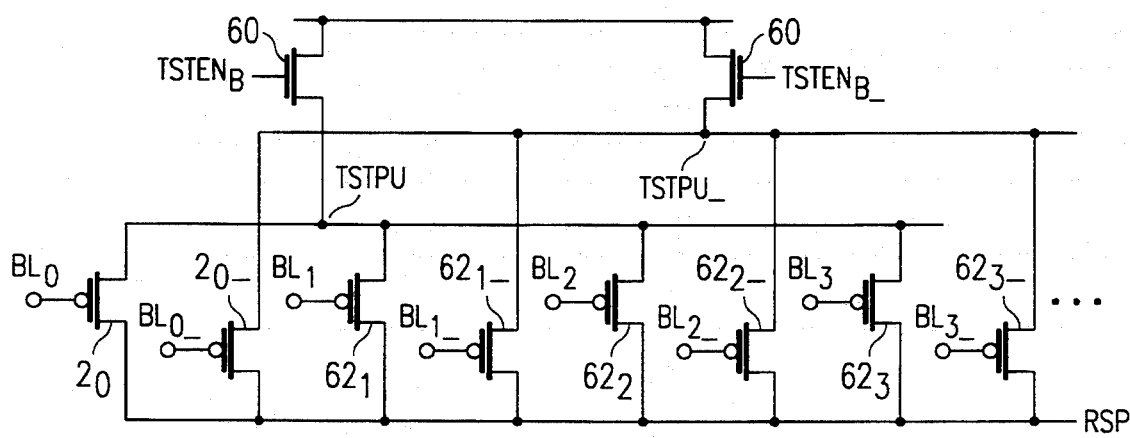
FIG. 10 is an electrical diagram, in schematic form, of a portion of the memory of FIG. 1 showing the preferred embodiment of the present invention as applied to bit lines in a column of the memory in an alternative manner.

FIG. 10 illustrates an example of an arrangement of bit line test transistors according to an alternative embodiment of the invention, in which the value of the written data is used in determining the result of the test. As shown in FIG. 10, each true bit line $BL_0$, $BL_1$, etc. is connected to the gate of a p-channel transistor 62 that has its drain connected to node TSTPU and its source connected to response node RSP, such that all of the transistors 62 controlled by a true bit line BL are connected in parallel between nodes TSTPU and RSP. N-channel pull-up transistor 60 has its drain biased to $V_{cc}$ and its source connected to node TSTPU. The gate of transistor 60 receives a decoded test enable signal $TSTEN_B$ which is activated in special test mode if the true bit lines BL are to be tested. Similarly, each of the complement bit lines $BL_0\_$, $BL_1\_$, etc. is connected to the gate of a p-channel transistor 62_ connected between node TSTPU_ and response node RSP (in common with transistors 62); an n-channel transistor 60_ is connected between $V_{cc}$ and node TSTPU_, with its gate controlled by a decoded test enable signal on line $TSTEN_{B\_}$.

The operation of the arrangement of FIG. 10 is similar to that of FIG. 9, in that the bit line under test turns on its respective transistor 62, 62_, driving a high logic level on its response node RSP when a low state is placed thereupon in a write operation. In order to test individual bit lines, the input data presented to the memory must be selected and input thereto in a sequence of special memory test cycles, with the results of the test compared after each cycle.

For example, where the complement bit lines for the selected address are to be tested, line $TSTEN_{B\_}$ is driven high to place the voltage $V_{cc}-V_{tn}$ at node TSTPU_, while line $TSTEN_B$ remains low so that transistors 62 cannot drive response node RSP high. A series of special memory test cycles are then performed to present a series of data to the memory. For by-eight memory 1, an example of such a sequence (for individually testing the complement bit lines) is as follows:

| Cycle | I/O |  |  |  |  |  |  |  | |
|---|---|---|---|---|---|---|---|---|---|
|  | 7 | 6 | 5 | 4 | 3 | 2 | 1 | 0 | |
| 1 | 0 | 0 | 0 | 0 | 0 | 0 | 0 | 0 | |
| 2 | 0 | 0 | 0 | 0 | 0 | 0 | 0 | 1 | (test $I/O_0$) |
| 3 | 0 | 0 | 0 | 0 | 0 | 0 | 1 | 0 | (test $I/O_1$) |
| 4 | 0 | 0 | 0 | 0 | 0 | 1 | 0 | 0 | (test $I/O_2$) |
| 5 | 0 | 0 | 0 | 0 | 1 | 0 | 0 | 0 | (test $I/O_3$) |
| 6 | 0 | 0 | 0 | 1 | 0 | 0 | 0 | 0 | (test $I/O_4$) |
| 7 | 0 | 0 | 1 | 0 | 0 | 0 | 0 | 0 | (test $I/O_5$) |
| 8 | 0 | 1 | 0 | 0 | 0 | 0 | 0 | 0 | (test $I/O_6$) |
| 9 | 1 | 0 | 0 | 0 | 0 | 0 | 0 | 0 | (test $I/O_7$) |

The first cycle of all zeros (i.e., no complementary bit line BL_ receives a low logic level) is performed to ensure that none of the complement bit lines are stuck low or otherwise in error, in which case response node RSP will be driven high despite the data state applied to the memory. After this first cycle, each succeeding cycle in this sequence then drives only one of the complement bit lines BL_ low to drive its response node RSP_, if the test is successful. Conversely, if response node RSP_ remains low for any of cycles 2 through 9 of this sequence, the complement bit line BL_ for that I/O is defective. In this way, only two decoded source lines (i.e., those coupled to the gates of transistors 60) and one response line is required to perform the bit line test.

Of course, it is contemplated that other alternatives and combinations of this embodiment of the invention, including the provision of AND functions between adjacent bit lines to detect bit lines that are shorted to one another, in similar manner as discussed hereinabove relative to the row line techniques of FIG. 5.

The use of twisted bit lines to cancel common-mode noise in modern high-density memories is well known in the art, as described in U.S. Pat. Nos. 3,942,164, 4,980,860, and 5,144,583. In such arrangements, each bit line will not only be adjacent to its complement for a portion of its length, but it will also be adjacent to two or more other bit lines for different columns. In this case, memory 1 may include a mask register to internally mask a multiple bit write to only one of column location in each special test cycle, so that only a single bit line is pulled low. Detection of shorting of the bit line to one of its neighbors can then be detected by measuring the response time of the response node. If multiple bit lines are activated due to a defect, the response node will be driven high earlier; conversely, if the bit line under test is shorted to a neighbor, the bit line load on the write driver is increased and the delay time of the response node will be longer.

Conclusion

The present invention enables the direct interrogation of internal circuits within an integrated circuit, to determine their functionality and thus to provide direct information to the analyst useful in determining the cause of failures, without time-consuming and labor-intensive visual inspection. This direct information regarding the internal functionality of the memory can be obtained even if all or most of a memory's bits exhibit failing behavior. In addition, it is contemplated that an automated functional test program may include a block of special test routines that are conditionally called in the event of functional failure, so that failure analysis information may be automatically obtained from a large number of devices, including massive failures.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A circuit for testing the operation of a signal driver and a signal line in a semiconductor memory, comprising:
   means for communicating a test mode signal indicating selection of a special test mode;
   a test transistor, having a control electrode coupled to the signal line at a location distant from the signal driver, and having a conduction path with a first end coupled to said communicating means to receive the special test mode signal; and
   a bias transistor, having a conduction path coupled between a second end of the conduction path of said test transistor and a bias voltage;
   wherein said test transistor is conductive responsive to receiving said special test mode signal at the first end of its conduction path in combination with receiving an active signal from the signal driver at its control electrode.

2. The circuit of claim 1, wherein the special test mode signal indicates selection of the special test mode when at a first logic level;
   and wherein said test transistor has a larger size than that of said bias transistor so that the voltage at the second end of the conduction path of the test transistor is near the first logic level when both said test transistor and said bias transistor are conductive.

3. The circuit of claim 1, further comprising:
   response logic coupled to the second end of said test transistor, and coupled to an external terminal of the memory.

4. The circuit of claim 1, wherein the signal driver comprises a row decoder in the memory;
   and wherein the signal line comprises a row line in the memory.

5. The circuit of claim 1, wherein the signal driver comprises a circuit for generating a control signal in the memory.

6. A semiconductor memory, comprising:
   a plurality of memory cells arranged in rows and columns;
   a row decoder, having a plurality of outputs, each coupled to one of a plurality of row lines, for selecting a row of memory cells responsive to a row address by energizing one of the plurality of row lines;
   circuitry for communicating a special test mode signal indicating, with a first logic level, selection of a special test mode;
   a first plurality of test transistors, each having a control electrode coupled to an associated row line at a location distant from said row decoder, and having a conduction path with a first end coupled to said communicating circuitry to receive the special test mode signal; and
   a first bias transistor, having a conduction path coupled between a second end of the conduction path of said each of said first plurality of test transistors and a bias voltage;
   wherein each of said first plurality of test transistors is conductive responsive to receiving said special test mode signal at the first end of its conduction path in combination with receiving an active row line signal at its control electrode.

7. The memory of claim 6, wherein the first ends of the conduction paths of each of said first plurality of test transistors are connected together to receive said special test mode signal in common.

8. The memory of claim 7, wherein the second ends of the conduction paths of each of said first plurality of test transistors are connected together and to said first bias transistor.

9. The memory of claim 6, wherein the second ends of the conduction paths of each of said first plurality of test transistors are connected together and to said first bias transistor.

10. The memory of claim 6, further comprising:
    a second plurality of test transistors, each having a control electrode coupled to an associated row line at a location distant from said row decoder, and having a conduction path with a first end coupled to said communicating circuitry to receive the special test mode signal; and
    a second bias transistor, having a conduction path coupled between a second end of the conduction path of said each of said second plurality of test transistors and the bias voltage;
    wherein each of said second plurality of test transistors is conductive responsive to receiving said special test mode signal at the first end of its conduction path in combination with receiving an active row line signal at its control electrode;
    and wherein said first and second pluralities of test transistors are associated with alternating ones of said row lines.

11. The memory of claim 6, wherein said row lines are energized with a voltage corresponding to the first logic level;
    and wherein the bias voltage corresponds to the first logic level.

12. A semiconductor memory comprising:
    a plurality of memory cells arranged in rows and columns;
    a row decoder for selecting a row of memory cells responsive to a row address by energizing one of a plurality of row lines extending away from said row decoder;
    a first plurality of test transistors, each having a control electrode coupled to an associated row line at a location distant from said row decoder, and having a conduction path with a first end for receiving a special test mode signal which indicates selection of a special test mode and selection of said first plurality of test transistors when at a first logic level;
    a first bias transistor, having a conduction path coupled between a second end of the conduction path of said each of said first plurality of test transistor and a bias voltage; and
    a second plurality of test transistors, each having a control electrode coupled to an associated row line at a location distant from said row decoder, and having a conduction path with a first end for receiving the special test mode signal which indicates selection of the special test mode and selection of said second plurality of test transistors when at the first logic level, and with a second end coupled to said first bias transistor;

wherein each of said first and second pluralities of test transistors is conductive responsive to receiving said special test mode signal at the first end of its conduction path in combination with receiving an active row line signal at its control electrode;

and wherein said first and second pluralities of test transistors are associated with alternating ones of said row lines.

13. A semiconductor memory, comprising:

a plurality of memory cells arranged in rows and columns;

a row decoder for selecting a row of memory cells responsive to a row address by energizing one of a plurality of row lines extending away from said row decoder;

a first plurality of test transistors, each having a control electrode coupled to an associated row line at a location distant from said row decoder, and having a conduction path with a first end for receiving a special test mode signal which indicates selection of a special test mode when at a first logic level;

a first bias transistor, having a conduction path coupled between a second end of the conduction path of said each of said first plurality of test transistor and a bias voltage;

a first adjacent test transistor having a conduction path, and having a control electrode coupled to a first row line; and a second adjacent test transistor having a conduction path, and having a control electrode coupled to a second row line adjacent to said first row line;

a second bias transistor, having a conduction path coupled on one end to the bias voltage;

wherein each of said first plurality of test transistors is conductive responsive to receiving said special test mode signal at the first end of its conduction path in combination with receiving an active row line signal at its control electrode;

and wherein the conduction paths of said first and second adjacent test transistors are connected in series between said second bias transistor, on one end, and connected on another end to receive the special test mode signal which indicates selection of the special test mode when at the first logic level.

14. A semiconductor memory, comprising:

a plurality of memory cells arranged in rows and columns, each of said columns associated with a true and a complement bit line;

a write circuit, coupled to true and complement bit lines of a selected column of memory cells, for presenting data to the true and complement bit lines of the selected column of memory cells in a write operation;

a plurality of true test transistors, each having a control electrode coupled to an associated true bit line of an associated column, and having a conduction path, said test transistor of a conductivity type so as to be conductive responsive to its associated true bit line being driven to a first voltage level by said write circuit; and a plurality of complement test transistors, each having a control electrode coupled to an associated complement bit line of an associated column, and having a conduction path, said test transistor also of a conductivity type so as to be conductive responsive to its associated complement bit line being driven to the first voltage level by said write circuit;

a first bias transistor, having a conduction path coupled between a bias voltage and a first end of the conduction path of each of said true and complement test transistors, and having a control electrode for receiving a signal indicating a special test mode or a normal operating mode, said bias transistor of the conductivity type so as to be conductive responsive to receiving the signal indicating the special test mode and non-conductive responsive to receiving the signal indicating normal operating mode.

15. The memory of claim 14, wherein said true and complement test transistors each have a larger size than that of said bias transistor so that the voltage at a second end of the conduction path of one of said true and complement test transistors is near the bias voltage when said one of said true and complement test transistors and said bias transistor are both conductive.

16. A method of diagnosing the cause of a defective integrated circuit memory, comprising:

biasing a first end of the conduction path of a first test transistor to a first bias voltage;

operating the memory in a normal operating mode;

after said operating step, entering a special test mode by biasing the first end of the conduction path of the first test transistors to a second bias voltage;

biasing a second end of the conduction path of the first test transistor to the first bias voltage, said first test transistor having a control electrode coupled to a signal line driven by a signal driver, said first test transistor of the conductivity type such that presence of an active signal at the signal line will cause the first test transistor to become conductive;

activating said memory to cause the signal driver to drive the active signal on the signal line;

monitoring the second end of the conduction path of the first test transistor to determine if the first test transistor has become conductive.

17. The method of claim 16, wherein the active signal is at a logic level corresponding to the first bias voltage.

18. The method of claim 16, wherein the signal driver comprises a row decoder and the signal line comprises a row line;

and wherein said activating step comprises:

presenting a row address to the row decoder.

19. The method of claim 16, wherein the activating step comprises:

writing data to a bit line;

and wherein the signal line comprises the bit line, and the signal driver comprises a write circuit.

20. A method of diagnosing the cause of a defective integrated circuit memory, comprising:

biasing a first end of the conduction path of a first test transistor to a first bias voltage;

biasing a second end of the conduction path of the first test transistor to a second bias voltage, said first test transistor having a control electrode coupled to a signal line driven by a signal driver, said first test transistor of the conductivity type such that presence of an active signal at the signal line will cause the first test transistor to become conductive;

activating said memory to cause the signal driver to drive the active signal on the signal line;

monitoring the second end of the conduction path of the first test transistor to determine if the first test transistor has become conductive repeating the biasing and monitoring steps for a second test transistor, said second test transistor having a control electrode coupled to a second signal line driven by a second signal driver, said second test transistor also of the conductivity type such that presence of an active signal at the second signal line will cause the second test transistor to become conductive; and after the monitoring steps, logically combining the logic levels at the second end of the conduction paths of the first and second test transistors.

21. A method of diagnosing the cause of a defective integrated circuit memory, comprising:

biasing a first end of the conduction path of a first test transistor to a first bias voltage;

biasing a second end of the conduction path of the first test transistor to a second bias voltage, said first test transistor having a control electrode coupled to a signal line driven by a signal driver, said first test transistor of the conductivity type such that presence of an active signal at the signal line will cause the first test transistor to become conductive;

activating said memory to cause the signal driver to drive the active signal on the signal line; and monitoring the second end of the conduction path of the first test transistor to determine if the first test transistor has become conductive, by monitoring a delay time between the activating step and the time at which the first test transistor becomes conductive.

* * * * *